United States Patent [19]
Paulick

[11] Patent Number: 6,018,584
[45] Date of Patent: Jan. 25, 2000

[54] ELECTRONIC COMPONENT ASSEMBLY FOR AN ELECTRONIC DEVICE AND METHOD OF ASSEMBLING THE SAME

[75] Inventor: Thomas Eugene Paulick, Palatine, Ill.

[73] Assignee: Motorola, Inc., Schaumburg, Ill.

[21] Appl. No.: 08/744,673

[22] Filed: Nov. 6, 1996

[51] Int. Cl.[7] ...................................................... H04R 3/00
[52] U.S. Cl. .............................................. 381/122; 381/91
[58] Field of Search ............................... 381/122, 91, 87, 381/355, 361; 439/66

[56] References Cited

U.S. PATENT DOCUMENTS

| | | | |
|---|---|---|---|
| 4,204,205 | 5/1980 | Yagi et al. | |
| 4,550,429 | 10/1985 | Burbank et al. | 381/91 |
| 4,932,883 | 6/1990 | Hsia et al. | 439/66 |
| 5,427,532 | 6/1995 | Owen et al. | |
| 5,627,901 | 5/1997 | Josephson et al. | 381/122 |

OTHER PUBLICATIONS

Hosiden, *Acoustic Units & Applied Products*, Catalog No. HC288, Sep. 1993, pp. 25–40, Hopewell Associates, Lake Bluff, IL.

*Primary Examiner*—Vivian Chang
*Attorney, Agent, or Firm*—John G. Rauch; John J. Oskorep; Richard K. Clark

[57] ABSTRACT

An electronic component assembly (102) for an electronic device (100) comprises an electronic component (140), a retainer (142), and an elastomeric connector (144). The electronic device (100) includes a housing (104, 106) and a printed circuit board (PCB) (108) having PCB throughholes (128, 130) and PCB conductive pads (200, 202). The electronic component (140) has a bottom side (146) including substantially planar conductive regions (152, 154) and electrical leads (148, 150) extending therefrom. The retainer (142) positions the elastomeric connector (144) adjacent to the substantially planar conductive pads (152, 154). Electronic component assembly (102) is placed and attached to the PCB (108) by inserting the electrical leads (148, 150) through the PCB throughholes (128, 130) and subsequently clinching the electrical leads (148, 150). When assembled, housing (104, 106) applies a force between the electronic component assembly (102) and the PCB (108) for electrically coupling, via the elastomeric connector (144), the substantially planar conductive regions (152, 154) and the PCB conductive pads (200, 202).

8 Claims, 3 Drawing Sheets

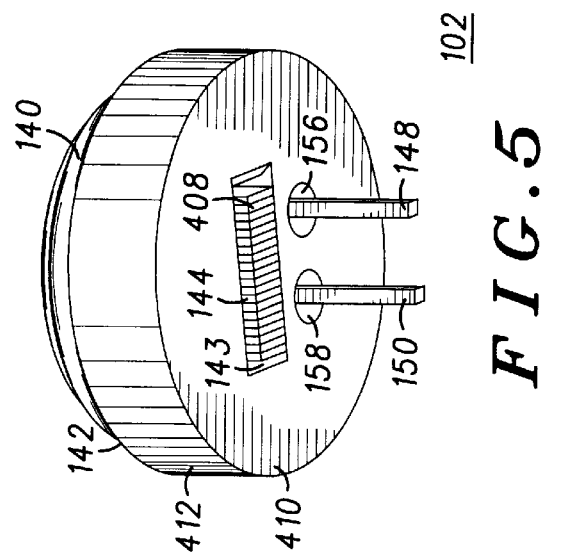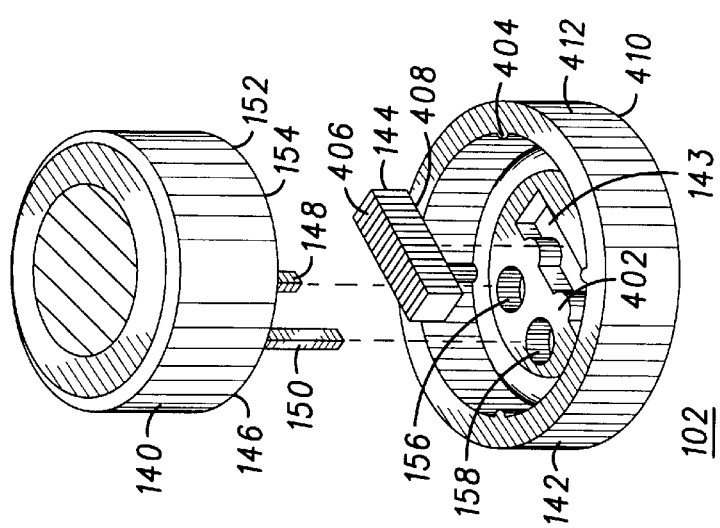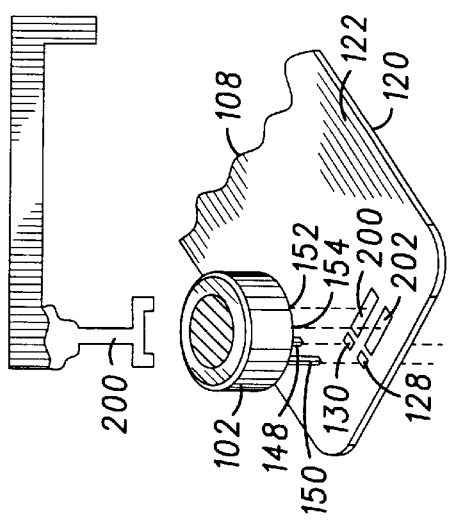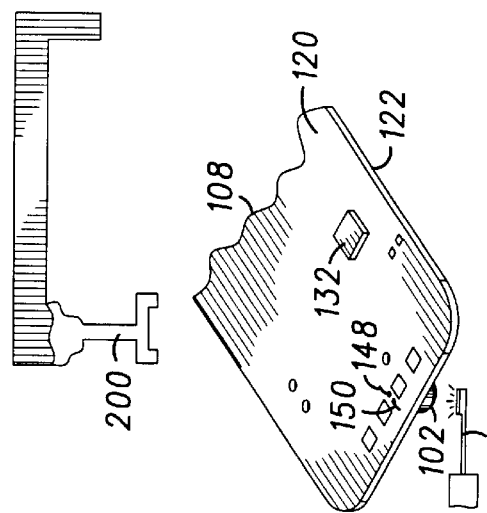

ELECTRONIC COMPONENT ASSEMBLY FOR AN ELECTRONIC DEVICE AND METHOD OF ASSEMBLING THE SAME

FIELD OF THE INVENTION

This invention relates generally to electronic component assemblies for electronic devices, and more specifically to microphone assemblies for communication devices.

BACKGROUND OF THE INVENTION

Electronic components, such as microphones, are used in a variety of electronic devices, such as radiotelephones. Microphones convert audible speech into electrical speech signals. The electrical speech signals are input to electrical circuitry that processes the signals.

Typically, microphones are employed in electronic devices having circuit components mounted on a printed circuit board (PCB). These circuit components are preferably electrically connected to the PCB by automated reflow heating. Microphones, however, cannot be connected to the PCB in this manner since they are heat sensitive and easily damaged. Once damaged, they can not be readily repaired.

Accordingly, microphones have been electrically coupled to PCBs via wires, flex strips, or two pin connectors and wires that are structurally connected to the PCB via hand soldering. In order to reduce the chance that the microphone will be damaged during hand soldering, a head sinkjig at a minimal temperature is employed for the shortest time necessary to produce a good solder joint. Unfortunately, microphones attached using wires or flex strips are susceptible to transmitter induced noise or "buzz." Flex strips are also costly and difficult to manipulate. Also, microphones that are custom-made to provide relatively easier circuit board assembly are typically more expensive than standard, "off-the-shelf" microphone components.

Therefore, what is needed is a electronic component assembly that facilitates automated mounting, avoids the use of wires, allows for easy repair, and is inexpensive.

BRIEF DESCRIPTION OF THE DRAWINGS

FIG. 2 shows an exploded, isometric view of a portion of a first side of the PCB and the electronic component assembly.

FIG. 3 shows an isometric view of a portion of a second side of the PCB and the electronic component assembly, and also shows an automated assembly apparatus and a testing apparatus.

FIG. 4 shows an exploded, close-up, top isometric view of the electronic component assembly, including an electronic component, an elastomeric connector, and a retainer.

FIG. 5 shows a close-up, bottom isometric view of the electronic component assembly.

DETAILED DESCRIPTION OF THE PREFERRED EMBODIMENTS

According to the present invention, an electronic component assembly, such as a microphone assembly, is assembled to an electronic device. The electronic component assembly comprises an electronic component, an elastomeric connector, and a retainer. The electronic device includes a housing and a printed circuit board (PCB) defining PCB throughholes and including PCB conductive pads. The electronic component has a bottom side including substantially planar conductive regions and electrical leads extending therefrom. The retainer positions the elastomeric connector adjacent to the substantially planar conductive pads of the electronic component. To facilitate assembly and testing, the electronic component assembly is placed and attached to the PCB by inserting the electrical leads through the PCB throughholes and subsequently clinching the electrical leads. When the electronic device is assembled, the housing applies a force between the electronic component assembly and the PCB for electrically coupling, via the elastomeric connector, the substantially planar conductive regions and the PCB conductive pads.

Figure 1:
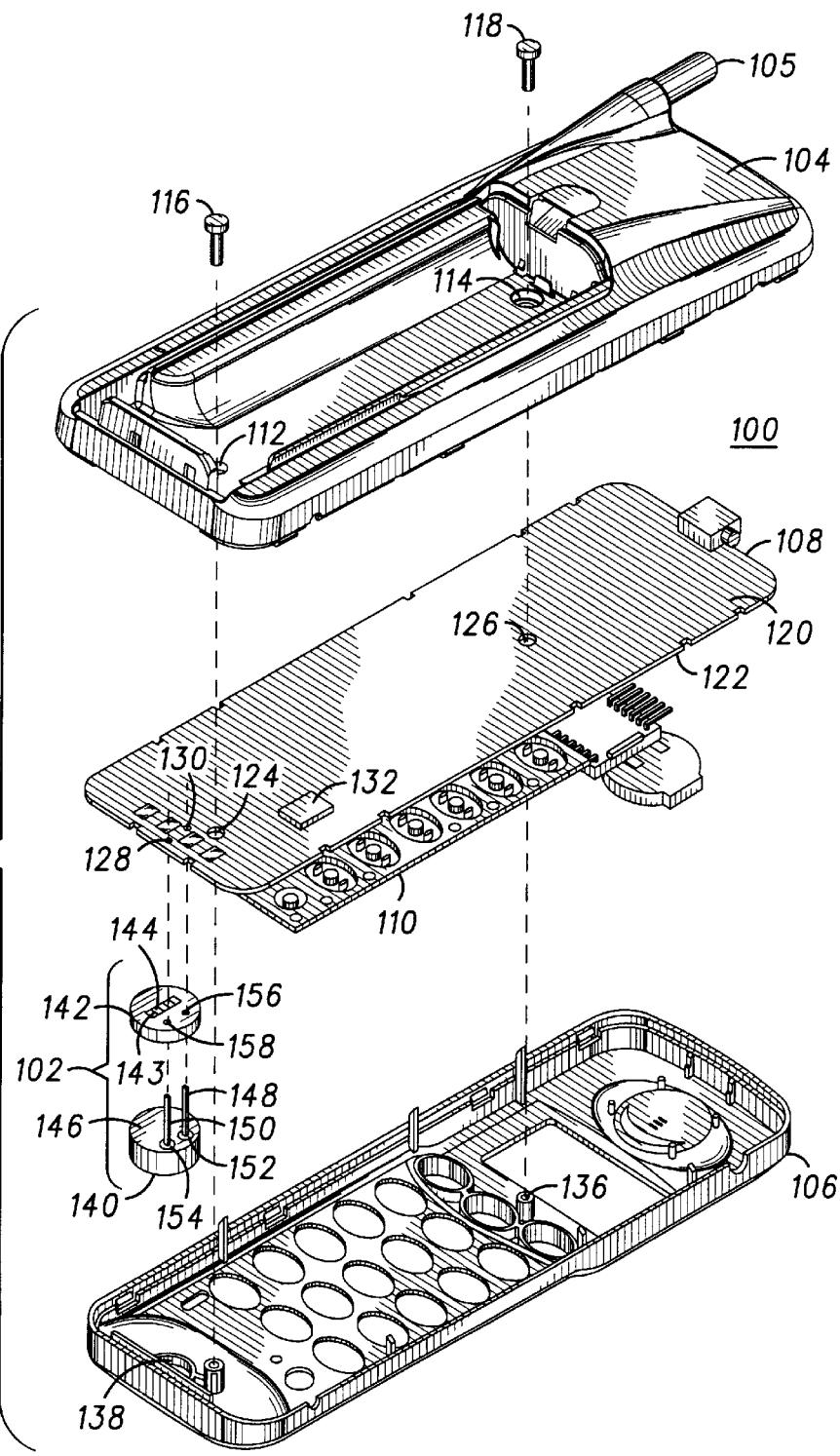
FIG. 1 is an exploded, isometric view of an electronic device that includes a housing, a printed circuit board (PCB), and an electronic component assembly.

FIG. 1 shows an exploded, isometric view of an electronic device 100. Electronic device 100 comprises an electronic component assembly 102, a housing, which includes housing portions 104 and 106, a printed circuit board (PCB) 108, and a keypad 110. Once assembled, electronic device 100 operates as a radiotelephone, such as a cellular telephone, which provides wireless telephone communications for a user thereof.

Electronic component assembly 102 comprises an electronic component 140, a retainer 142, and an elastomeric connector 144. Electronic component 140 has a bottom surface 146 including substantially planar conductive regions 152 and 154 and electrical leads 148 and 150 extending therefrom. Using conventional methods, electronic component 140 is typically attached and electrically connected to a PCB by inserting electrical leads 148 and 150 through PCB throughholes and soldering them to conductive regions surrounding the PCB throughholes. These conventional methods unfortunately take time and may damage the electronic component when connected to the PCB.

Elastomeric connector 144, illustrated more clearly in the exploded view of electronic component assembly 102 in FIG. 4, is an electrical coupling apparatus made of alternating layers of conductive and non-conductive silicone rubber. Such a coupling apparatus is used in a variety of different ways. Typically, for example, an elastomeric connector is used for electrically coupling a first conductive pad of a first PCB with a second conductive pad of a second PCB by properly aligning and "sandwiching" the elastomeric connector between the first and second PCBs. Sufficient force between the first and the second PCBs is typically required to ensure an electrical connection therebetween.

Retainer 142 is a device for positioning elastomeric connector 144 in relation to electronic component 140. As shown in the illustrated embodiment of FIG. 4, retainer 142 defines a bottom portion 410 and a rim portion 412. Bottom portion 410 defines throughholes 156 and 158 and a slot 143. Elastomeric connector 144 is disposed within slot 143. Electronic component 140 is disposed within retainer 142 such that rim portion 412 surrounds the outer edge of electronic component 140 and electrical leads 148 and 150 extend through throughholes 156 and 158, respectively (FIG. 5). Retainer 142 is preferably made from a somewhat pliable material, such as rubber.

Preferably, slot 143 and elastomeric connector 144 are sized such that elastomeric connector 144 can be pressure-fitted and thereby secured within slot 143. Also preferably, rim portion 412 is sized such that electronic component 140 can be pressure-fitted and thereby secured within retainer 142. To facilitate such fit, retainer 142 is integrally defined with nubs, such as a nub 402 within slot 143 and a nub 404 within rim portion 412.

When both elastomeric connector 144 and electronic component 140 are retained by retainer 142, a first side 406 of elastomeric connector 144 is exposed and positioned adjacent to substantially planar conductive regions 152 and 154. A second side 408 of elastomeric connector 144, more visibly shown in FIG. 5, is outwardly exposed from retainer 142 and facing opposite first side 408. Second side 408 is exposed for making contact with PCB conductive pads 200 and 202 (FIG. 2) when electronic component assembly 102 is attached to PCB 108.

As shown in the illustrated embodiment, electronic component 140 comprises a microphone. Preferably, electronic component 140 is a small, standard microphone of the electret type. Such microphones are well-known, low-cost, "off-the-shelf" components. Like many microphones, electronic component 140 cannot be subject to automated reflow heating since it is heat sensitive and easily damaged. Preferably, the microphone has a housing with a diameter of approximately 9.7 mm and a height of approximately 4.5 mm.

Figure 6:
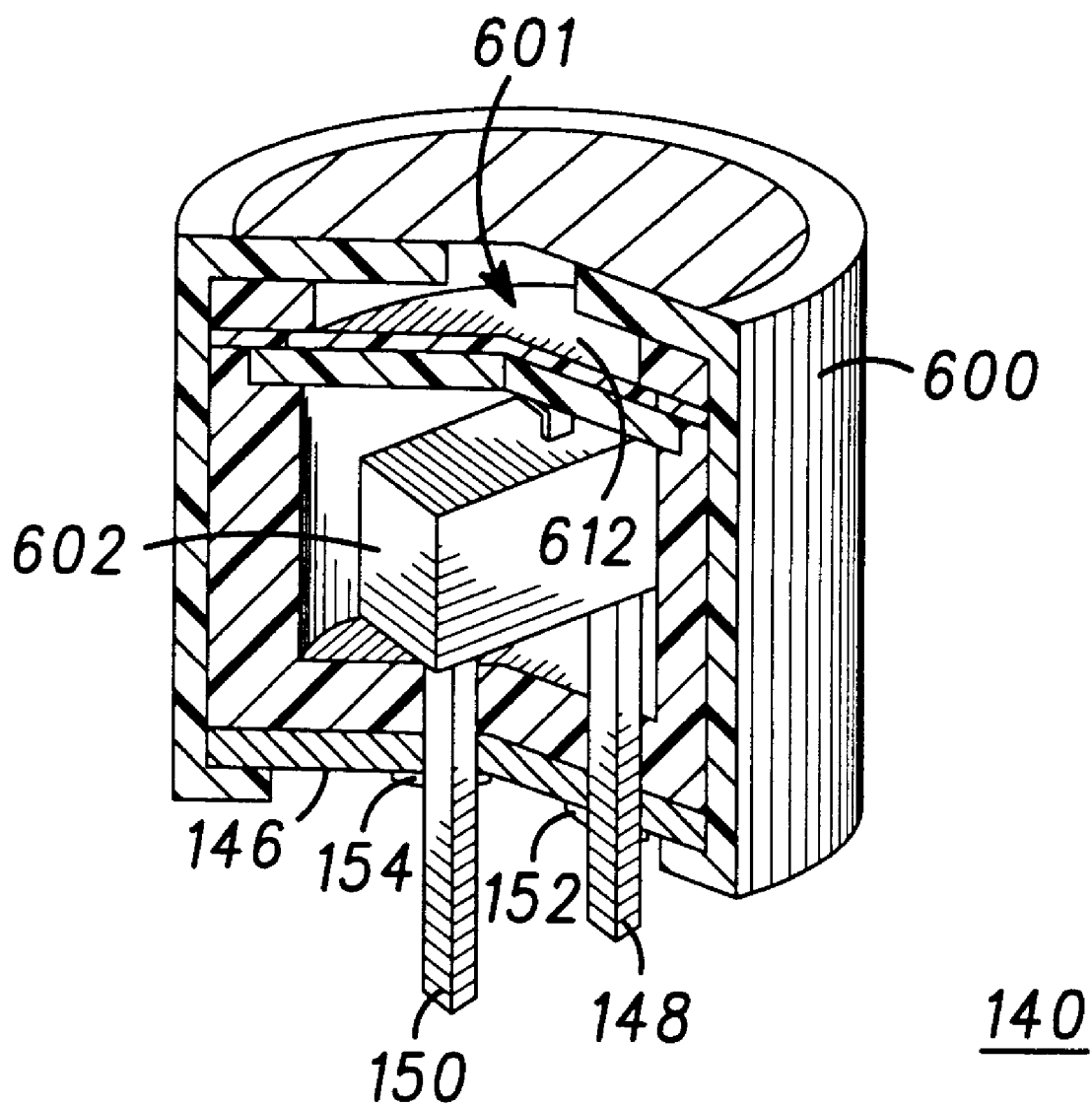
FIG. 6 shows a cross-sectional view of a microphone of a microphone assembly.

Referring to FIG. 6, a cross-sectional view of such a microphone is shown. Electronic component 140 includes a transducer 601 disposed within a housing 600. Transducer 601 converts sound waves, such as audible speech, into electrical signals. Transducer 601 may be implemented using any suitable commercially available transducer, such as that embodied in an electret condenser microphone (ECM). Transducer 601 includes a diaphragm 612 and a field-effect transistor (FET) 602. Diaphragm 612 has a permanent charge and is capacitively coupled between the source and the gate of FET 602. The drain and gate of FET 602 comprise electrical leads 148 and 150 that outwardly extend from electronic component 140 through bottom surface 146.

Electrical leads 148 and 150 are typically used to electrically connect transducer 601 to a PCB when inserted through throughholes of the PCB and soldered to conductive regions surrounding the throughholes. Electrical leads 148 and 150 are substantially rigid members and are electrically coupled to substantially planar conductive regions 152 and 154, respectively, provided on bottom surface 146. Electrical leads 148 and 150 are cylindrical and may be manufactured of aluminum, tin, or other suitable metal. Preferably, electrical leads 148 and 150 each have a diameter of approximately 0.65 mm, a length of approximately 4.5 mm, and a spacing therebetween of approximately 2.5 mm.

When used in conjunction with a microphone, retainer 142 may be more commonly referred to as a grommet (having "grommet" throughholes). In addition to providing the positioning of elastomeric connector 144, grommet provides an acoustic seal for the microphone to improve the quality of an incoming audio signal.

Referring back to FIG. 2, PCB 108 is a substrate having a first side 120 and a second side 122. PCB 108 defines PCB throughholes 128 and 130 and includes PCB conductive pads 200 and 202 adjacent thereto. PCB throughholes 128 and 130 are holes that extend through PCB 108 from first side 120 to second side 122. PCB conductive pads 200 and 202 are inlaid so as to be substantially flush with second side 122. PCB conductive pads 200 and 202 are made from an electrically conductive material, such as carbon, and are coupled to conductive traces (not shown) on or within PCB 108. PCB 108 is preferably comprised of fiberglass reinforced phenolic or other suitable material.

Electronic components, such as electronic components associated with electronic circuit 132 (FIG. 1), are reflow soldered onto PCB 108 before electronic component assembly 102 is assembled thereto. As stated previously, electronic component 140 cannot be reflow soldered to PCB 108 in this manner since it heat sensitive and easily damaged. Once reflow soldered, the conductive traces of PCB 108 electrically couple electronic circuit 132 to PCB conductive pads 200 and 202 (FIG. 2).

After PCB 108 is reflow soldered, PCB 108 is ready for electronic component assembly 102 to be assembled thereto. Preferably, electronic component assembly 102 is itself assembled before it is mounted on PCB 108. FIGS. 2 and 5 show electronic component assembly 102 in such assembled form. After such preassembly, and after PCB 108 is reflow soldered with electrical components, electronic component assembly 102 is picked up and placed onto PCB 108. Preferably, such placement is performed by an automated assembly apparatus, such as an automated assembly apparatus 200 shown in FIG. 2. During placement of electronic component assembly 102, electrical leads 148 and 150 are inserted through PCB throughholes 128 and 130, respectively. Thus, a desired position for electronic component assembly 102 on PCB 108 is maintained. Here, substantially planar conductive regions 152 and 154 of electronic component 140 are properly aligned with PCB conductive pads 200 and 202, respectively, such that elastomeric connector 144 can provide electrical coupling respectively therebetween.

Electrical leads 148 and 150 extend through PCB throughholes at a length sufficient to retain electronic component assembly 102 on PCB 108. For example, when PCB 108 is physically moved in a plane parallel thereto, electronic component assembly 102 maintains its desired position. However, the length of electrical leads 148 and 150 do not extend so far as to hinder the assembly process or as to interfere with other electronic components on PCB 108. Preferably, electrical leads 148 and 150 each extend approximately 3 mm beyond PCB 108 after insertion.

After placement of electronic component assembly 102, at least one of electrical leads 148 and 150 is "clinched" or bent for physically securing electronic component assembly 102 to PCB 108. FIG. 3 shows a portion of second side 122 of PCB 108 where electronic component assembly 102 is mounted thereon and where both electrical leads 148 and 150 are clinched. Such clinching may be performed by automated assembly apparatus 200 or by an individual. Electronic component assembly 102 is thus physically secured to PCB 108, where PCB 108 may be repositioned and rotated in any fashion without electronic component assembly 102 losing its desired position on or falling off of PCB 108. However, at this point, electronic component 140 is not necessarily electrically coupled to PCB 108 since the sufficient force typically required when using an elastomeric connector is not applied between electronic component assembly 102 and PCB 108.

After placement. PCB 108 goes through a testing process that tests the electrical operation thereof. During the testing process, PCB 108 is tested for full operation of all electronic components mounted thereon, including electronic component 140. During the testing process, a testing apparatus 302 shown in FIG. 3 is utilized. Testing apparatus 302 applies a force between electronic component assembly 102 and PCB 108 so that electronic component 140 is electrically coupled to PCB 108 through elastomeric connector 144. While applying such force, testing apparatus 302 applies a 1 KHz audio signal to electrical component 140. A test probe (not shown) is applied to electronic circuit 132 to verify continuity between electronic component 140 and electronic circuit 132, and also to verify the audio performance of electronic component assembly 102. Other signals and circuits, for example, modulated radio frequency (RF) signals from a transmitter of PCB 108, can be tested where testing apparatus 302 is used in a similar manner.

After the testing process, electronic device 100 goes though a final assembly stage. Referring back to FIG. 1, PCB 108 and keypad 110 are disposed within housing portions 104 and 106, which are comprised of plastic or other suitable material. Housing portion 104 defines screw holes 112 and 114 and housing portion 106 integrally defines bored attachment bosses 134 and 136. PCB 108 defines screw holes 124 and 126, each of which extend between first and second sides 120 and 122. As shown by the dashed lines, housing portions 104 and 106 mate and are fixed together. Screws 116 and 118 insert through screw holes 112 and 114, respectively, and through screw holes 124 and 126, respectively, and threadedly attach within bored attachment bosses 134 and 136. Upon such assembly, housing portion 106 applies a force to electronic component assembly 102 towards PCB 108, and housing portion 106 applies an opposite force to PCB 108 towards electronic component assembly 102. Thus, by assembling housing portions 104 and 106, a sufficient force is applied for electrically coupling, via elastomeric connector 144, electronic component 140 to PCB 108. Although the use of housing portions 104 and 106 is preferred, other suitable fastening apparatuses may be employed as well.

Housing portion 104 also defines a battery compartment 107 for a battery (not shown). When fully assembled and installed with a battery, electronic device 100 operates in radio communication system by communicating with a base station (not shown) via RF signals. Audible signals detected by electronic component assembly 102 are converted into electrical speech signals. The electrical speech signals are coupled to electronic circuit 132 which is a transceiver circuit. Electronic circuit 132 converts the electrical speech signals into electrical RF signals. The electrical RF signals are converted by antenna 105 and transmitted to the base station as RF signals.

Although electronic device 100 is illustrated as a cellular radiotelephone, it will be recognized that portable computers, cordless telephones, two-way radios, personal digital assistants, and the like, can also benefit from the use of the electronic component assembly, and "device" as used herein shall refer to any such equipment and their equivalents.

Once attached, microphone assembly 102 is held in assemblage by PCB 108 after electrical leads 148 and 150 are bent or clinched as shown in FIG. 3. Transducer 601 of electronic component 140 is electrically connected to electronic circuit 132 and an electrical ground via an electrical connection. Transducer 601 operates via DC voltage supplied to electrical lead 148 (the drain of FET 602) from electronic circuit 132 (FIG. 6). Sound waves entering microphone 140 displace diaphragm 612 of transducer 601, inducing voltage variations at the source of FET 602. In response thereto, FET 602 generates output signals on electrical lead 150 (the drain of FET 602) having a voltage proportional to the sound pressure placed on diaphragm 612. The output signals are thus modulated on the DC voltage and coupled to electronic circuit 132 via a trace (not shown) on PCB 108.

It can thus be seen that electronic component assembly 102, and the automated fabrication facilitated thereby, is advantageous over previous microphone assemblies that utilize hand soldered wires or flex strips. Electronic component assembly 102 eliminates the time consuming, unreliable, and potentially damaging hand soldering previously required to attach wires and flex strips to microphones. Microphone buzz attributed to lengthy wires and flex strips is significantly reduced. Reduced buzz allows for an overall electrical part reduction to electronic device 100. For example, shielding apparatuses previously employed to eliminate microphone buzz are no longer needed. In addition, electronic component assembly 102 permits easy removal of electronic component 140 for repair or replacement. To detach electronic component assembly 102 from PCB 108, electrical leads 148 and 150 need only to be straightened back to their initial linear positions, where electronic component assembly 102 can be lifted away from PCB 108. Finally, using an electronic component which is a standard, "off-the-shelf" component with electrical leads lowers the overall cost of electronic device 100.

Although a microphone assembly is illustrated herein, it will be recognized that other assemblies could be adapted to engage electronic components with greater or fewer electrical leads. In addition, it will be recognized that the attachment disclosed herein could be used to automate attachment of other heat sensitive electronic components including, but not limited to, displays, speakers, and light emitting diodes (LEDs).

While particular embodiments of the present invention have been shown and described, modifications may be made. It is therefore intended in the appended claims to cover all such changes and modifications which fall within the true spirit and scope of the invention.

What is claimed is:

1. A portable communication device, comprising:

a printed circuit board (PCB) defining two PCB throughholes and including two PCB conductive pads;

an electronic circuit carried on said PCB and coupled to the two PCB conductive pads;

a microphone assembly carried on said PCB, said microphone assembly including:

a grommet defining a slot;

an elastomeric connector disposed within the slot of said grommet, said elastomeric connector having a first side and a second side, the first side positioned adjacent to the two PCB conductive pads;

a microphone disposed within said grommet, said microphone having a bottom surface including two substantially planar conductive regions and two electrical leads extending from the conductive regions, the two substantially planar conductive regions positioned adjacent to the second side of said elastomeric connector, the two electrical leads positioned through said grommet and through the two PCB throughholes; and a fastening apparatus to provide pressure between said microphone assembly and said PCB to maintain an electrical connection between the microphone and the electronic circuit via said elastomeric connector.

2. The portable communication device according to claim 1 wherein said fastening apparatus comprises a housing of said communication device.

3. The portable communication device according to claim 1 wherein at least one of the two electrical leads is bent after insertion through the two PCB throughholes to physically secure said microphone assembly to said PCB.

4. The portable communication device according to claim 1 wherein said elastomeric connector comprises alternating layers of conductive and nonconductive material.

5. A method of assembling a portable communication device, the portable communication device including a printed circuit board (PCB) and a microphone assembly, the PCB defining PCB throughholes and including PCB conductive pads, the microphone assembly including a microphone and an elastomeric connector, the microphone having a bottom surface including conductive regions and electrical leads extending from the conductive regions, the method comprising the steps of:

inserting the electrical leads of the microphone through the PCB throughholes, wherein the step of inserting includes the substep of positioning the elastomeric connector between the conductive regions of the microphone and the conductive pads of the PCB; and applying a force between the microphone assembly and the PCB to electrically couple, with the elastomeric connector, the conductive regions of the microphone and the conductive pads of the PCB.

6. The method according to claim 5 further comprising the step of:

bending at least one of the electrical leads to physically secure the microphone assembly to the PCB.

7. The method according to claim 5 wherein the step of applying a force between the microphone assembly and the PCB includes the substep of applying a force with a testing apparatus.

8. The method according to claim 5 wherein the portable communication device further includes a housing containing the PCB and the microphone assembly, and wherein the step of applying a force between the microphone assembly and the PCB includes the substep of applying a force with the housing when assembled.

* * * * *